(12) United States Patent
Hsu et al.

(10) Patent No.: US 7,742,276 B2
(45) Date of Patent: Jun. 22, 2010

(54) WIRING STRUCTURE OF LAMINATED CAPACITORS

(75) Inventors: Chien-Min Hsu, Wugu Shiang (TW); Shih-Hsien Wu, Yangmei Town (TW); Min-Lin Lee, Hsinchu (TW); Shinn-Juh Lai, Zhudong Town (TW)

(73) Assignee: Industrial Technology Research Institute, Hsinchu (TW)

( * ) Notice: Subject to any disclaimer, the term of this patent is extended or adjusted under 35 U.S.C. 154(b) by 378 days.

(21) Appl. No.: 11/950,381

(22) Filed: Dec. 4, 2007

(65) Prior Publication Data

US 2008/0239622 A1    Oct. 2, 2008

Related U.S. Application Data

(60) Provisional application No. 60/908,973, filed on Mar. 30, 2007.

(51) Int. Cl.
*H01G 4/228* (2006.01)
(52) U.S. Cl. .............. 361/306.2; 361/306.1; 361/306.3; 361/303; 361/311; 361/313
(58) Field of Classification Search .............. 361/306.2, 361/306.1, 306.3, 303–305, 311–313, 321.1, 361/321.2, 307, 308.1
See application file for complete search history.

(56) References Cited

U.S. PATENT DOCUMENTS

| | | | |
|---|---|---|---|
| 4,570,031 A | 2/1986 | Inoue | |
| 4,714,952 A | 12/1987 | Takekawa et al. | |
| 5,161,086 A | 11/1992 | Howard et al. | |
| 5,162,977 A | 11/1992 | Paurus et al. | |
| 5,225,969 A | 7/1993 | Takaya et al. | |
| 5,428,885 A | 7/1995 | Takaya et al. | |
| 5,469,324 A | 11/1995 | Henderson et al. | |
| 5,910,755 A | 6/1999 | Mishiro et al. | |
| 5,912,809 A | 6/1999 | Steigerwald et al. | |
| 6,021,050 A | 2/2000 | Ehman et al. | |
| 6,043,987 A | 3/2000 | Goodwin et al. | |
| 6,068,782 A | 5/2000 | Brandt et al. | |
| 6,114,015 A | 9/2000 | Fillion et al. | |
| 6,215,649 B1 | 4/2001 | Appelt et al. | |
| 6,333,857 B1 | 12/2001 | Kanbe et al. | |
| 6,343,001 B1 | 1/2002 | Japp et al. | |

(Continued)

*Primary Examiner*—Nguyen T Ha
(74) *Attorney, Agent, or Firm*—Finnegan, Henderson, Farabow, Garrett & Dunner, LLP

(57) ABSTRACT

The present invention relates to a wiring structure for reducing the equivalent series inductance (ESL) of a laminated capacitor. The laminated capacitor comprises a number of conductive layers, a power via extending along a thickness direction of the laminated capacitor and arranged to extend from the top conductive layer to the bottom conductive layer, and a ground via extending along the thickness direction of the laminated capacitor and arranged to extend from the top conductive layer to the bottom conductive layer. The conductive layers include a set of first conductive layers and a set of second conductive layers. The power via is electrically coupled to the first conductive layers and the ground via is electrically coupled to the second conductive layers. The laminated capacitor further comprises a supplemental via between the power via and the ground via. The supplemental via is shorter in length than the power via and the ground via. The supplemental via is electrically coupled to one of the first conductive layers and the second conductive layer.

19 Claims, 4 Drawing Sheets

U.S. PATENT DOCUMENTS

| | | |
|---|---|---|
| 6,349,456 B1 | 2/2002 | Dunn et al. |
| 6,351,369 B1 * | 2/2002 | Kuroda et al. ............ 361/306.3 |
| 6,370,012 B1 | 4/2002 | Adae-Amoakoh et al. |
| 6,370,013 B1 * | 4/2002 | Iino et al. ................ 361/306.3 |
| 6,407,929 B1 | 6/2002 | Hale et al. |
| 6,446,317 B1 | 9/2002 | Figueroa et al. |
| 6,496,356 B2 | 12/2002 | Japp et al. |
| 6,524,352 B2 | 2/2003 | Adae-Amoakoh et al. |
| 6,556,420 B1 | 4/2003 | Naito et al. |
| 6,574,090 B2 | 6/2003 | Appelt et al. |
| 6,606,237 B1 * | 8/2003 | Naito et al. ............... 361/306.3 |
| 6,610,417 B2 | 8/2003 | Andresakis et al. |
| 6,616,794 B2 | 9/2003 | Hartman et al. |
| 6,618,238 B2 | 9/2003 | Sanville, Jr. et al. |
| 6,621,682 B1 * | 9/2003 | Takakuwa et al. ........ 361/306.3 |
| 6,625,857 B2 | 9/2003 | Appelt et al. |
| 6,678,145 B2 | 1/2004 | Naito et al. |
| 6,783,620 B1 | 8/2004 | Smith et al. |
| 6,789,298 B1 | 9/2004 | Fillion et al. |
| 6,795,294 B2 | 9/2004 | Kuroda et al. |
| 6,809,268 B2 | 10/2004 | Hayashi et al. |
| 6,813,138 B1 | 11/2004 | Jow et al. |
| 6,815,085 B2 | 11/2004 | Appelt et al. |
| 6,819,543 B2 | 11/2004 | Vieweg et al. |
| 7,050,288 B2 * | 5/2006 | Ahiko et al. ................ 361/303 |
| 7,394,643 B2 * | 7/2008 | Yamane et al. ............. 361/303 |
| 7,414,857 B2 * | 8/2008 | Ritter et al. ................. 361/756 |

* cited by examiner

WIRING STRUCTURE OF LAMINATED CAPACITORS

BACKGROUND OF THE INVENTION

1. Field of the Invention

This invention generally relates to capacitors, and more particularly, to a wiring structure of laminated capacitors.

2. Background of the Invention

Multilayer printed circuit boards (PCBs) are used in computer systems and electronic devices for interconnecting integrated circuit (IC) chips and other electronic components and devices. In recent years, substantial efforts have been expended in the design of such PCBs and the device arranged thereupon to compensate for voltage fluctuations arising between the power and ground planes in the PCBs. The voltage fluctuations, including switching noises, may be caused by switching or other operations of transistors or other devices in integrated circuits. A common solution to this problem is to place one or more capacitors serving as decoupling capacitors or bypass capacitors coupled between the power and ground planes near the integrated circuits.

Capacitors may be electrically coupled either as discrete elements mounted on the surface of a circuit board, or may be embedded within the circuit boards. Generally, discrete decoupling capacitor or surface mounted device (SMD) decoupling capacitors are often used to reduce undesirable voltage fluctuations. However, SMD decoupling capacitors may become less effective in many modern applications. For example, SMD decoupling capacitors usually occupy a large surface area of a PCB and may limit package design when a smaller board is needed. In addition, since SMD decoupling capacitors are mounted on a PCB, the distance between an IC's power supply and the associated SMD decoupling capacitors are greater than the distance between the IC's power supply and the capacitors embedded within the PCB. Therefore, the use of SMD decoupling capacitors causes greater parasitic inductance and reduces the effectiveness of reduction on voltage fluctuations. In other words, when the operating frequency reaches to hundreds of megaherts (MHz) or even several gigahertz (GHz), SMD decoupling capacitors become ineffective for reducing and stabilizing voltage fluctuations.

FIG. 1 is an impedance curve for exemplary surface mounted capacitors of 1 μF (including low inductance 0612 and 1206 capacitors and a capacitor from Inter-Digitated Capacitors (IDC)) in the frequency range from 0.01 MHz to 1000 MHz. Referring to FIG. 1, the impedance of the capacitors exceeds the desirable impedance (about 0.5 ohm) when the operating frequency reaches hundreds of MHz. The desirable impedance for future designs will be lower, which can be as low as 0.1 ohm or below. Accordingly, none of those SMD capacitors provide a sufficiently low impedance when being operated at high frequencies. Specifically, the poor high frequency performance of surface mounted capacitors make them unsuitable for today's high speed integrated circuits, which may operate at a frequencies in GHz ranges.

Laminated capacitors embedded in a circuit board may save the surface area of circuit boards. In addition, because laminated capacitors may be placed much closer to the integrated circuits, they may minimize parasitic inductance caused by the internal wirings. While the laminated capacitors may provide a better decoupling effect, the laminated capacitors also suffer the parasitic effect due to the inductance from the power and ground vias. The parasitic effect becomes significant as the circuit frequency of the capacitor becomes higher. In the some applications, the capacitor characteristics can be impacted to a stage that the capacitor exhibits significant inductance effects. The threshold frequency for such transition in characteristics is known as the self-resonance frequency. Equation (1) below represents the self-resonance frequency:

$$fr = \frac{1}{2\pi\sqrt{LC}} \quad (1)$$

where $f_r$ represents the self-resonance frequency, L represents the parasitic inductance (i.e., equivalent series inductance "ESL"), and C represents the parasitic capacitance (i.e., equivalent series resistance "ESR"). According to Eq. (1) above, the function of a capacitor is lost at a higher frequency than the resonance frequency. In other words, the self-resonance frequency becomes high when the ESL value is small.

In modern high-speed circuit designs, electronic components are required to function well in high frequency regions. Accordingly, it is desirable to lower the ESL and impedance in high frequency circuit applications, thereby increasing its decoupling effect or its bypass bandwidth. Certain wiring structures of a laminated capacitor capable of lowering the value of the parasitic inductance have been developed in recent years.

U.S. Pat. No. 5,161,086 to Howard et al. describes a common wiring connection structure as shown at FIG. 2 for laminated capacitors in a multilayer circuit board. Referring to FIG. 2, the surface mounted integrated circuit 14' is interconnected with the conductive layers 28' and 30' of a laminated capacitor respectively through power and ground leads 34' and 36'. The power lead 34' is connected with the conductive layers 28' and passes through a hole in the conductive layer 30'. Similarly, the ground lead 36' passes through a hole in the conductive layer 28' while being electrically coupled with the conductive layer 30'. In this manner, the integrated circuit 14' is properly connected with both the power and ground planes.

U.S. Pat. No. 6,678,145 to Naito et al. proposes a wiring connection structure of laminated capacitors that may lower the value of the parasitic inductance. FIG. 3(a) is a plan view of the internal structure of the laminated capacitor 41. FIG. 3(b) shows a cross-section along the line III-III shown in FIG. 3(a). Referring to FIG. 3(a), a number of first feedthrough conductors 46 and second feedthrough conductors 47 respectively connect to the first internal electrodes 44 and the second internal electrodes 45. Each of the first feedthrough conductors 46 is arranged adjacent to a second feedthrough conductor 47, thus diversifying the direction of the electric current flowing through the internal electrodes 44 and 45. In this manner, the magnetic fields induced by the electric current flowing through the internal electrodes may be offset and the length of the current flow path may be shorten. As a result, the ESL value may be decreased.

BRIEF SUMMARY OF THE INVENTION

One example consistent with the invention provides a laminated capacitor which comprises a number of conductive layers including a top conductive layer and a bottom conductive layer, a power via extending along a thickness direction of the laminated capacitor and arranged to extend from the top conductive layer to the bottom conductive layer, and a ground via extending along the thickness direction of the laminated capacitor and arranged to extend from the top conductive layer to the bottom conductive layer. The conductive layers include a set of first conductive layers and a set of second conductive layers. The power via is electrically coupled to the first conductive layers and the ground via is electrically coupled to the second conductive layers. The laminated capacitor further comprises a supplemental via between the power via and the ground via. The supplemental via is shorter in length then the power via and ground via. The supplemental via is electrically coupled to one of the first conductive layers and the second conductive layer.

Another example consistent with the invention provides a laminated capacitor embedded in a circuit board. The laminated capacitor comprises a number of conductive layers, a power via extending along a thickness direction of the laminated capacitor and arranged to extend from the top conductive layer to the bottom conductive layer, and a ground via extending along the thickness direction of the laminated capacitor and arranged to extend from the top conductive layer to the bottom conductive layer. The conductive layers include a set of first conductive layers and a set of second conductive layers. The power via is electrically coupled to the first conductive layers and the ground via is electrically coupled to the second conductive layers. The laminated capacitor further comprises a supplemental via between the power via and the ground via. The supplemental via is shorter in length than the power via and the ground via. The supplemental via is electrically coupled to one of the first conductive layers and the second conductive layers. The laminated capacitor further comprises a number of dielectric layers, each being sandwiched between two neighboring conductive layers. The laminated capacitor may be used in a variety of printed circuit applications. For example, they may be coupled with or embedded within rigid and/or flexible electrical circuit, printed circuit boards or other microelectronic devices such as chip packages.

In another example consistent with the invention, an integrated circuit substrate to which an integrated circuit chip is coupled to, comprises a wiring board comprising a power plane and a ground plane, a laminated capacitor being electrically coupled to the power plane and ground plane. The laminated capacitor comprises a number of conductive layers including a top conductive layer and a bottom conductive layer, a power via extending along a thickness direction of the laminated capacitor and arranged to extend from the top conductive layer to the bottom conductive layer, and a ground via extending along the thickness direction of the laminated capacitor and arranged to extend from the top conductive layer to the bottom conductive layer. The conductive layers include a set of first conductive layers and a set of second conductive layers. The power via is electrically coupled to the first conductive layers and the ground via is electrically coupled to the second conductive layers. The laminated capacitor further comprises a supplemental via between the power via and the ground via. The supplemental via is shorter in length than the power via and the ground via. The supplemental via is electrically coupled to one of the first conductive layers and the second conductive layers. The laminated capacitor further comprises a number of dielectric layers, each being sandwiched between two neighboring conductive layers.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

The present invention provides a wiring structure of laminated capacitors in a circuit board where a supplemental via is disposed between a ground via and a power via. The supplemental via may be shorter in length than the ground vias or the power vias. Because the electrical current takes a shorter path, especially when at high frequencies, the current flows through the supplemental via and one of the ground via or power via that provides a shorter current loop. As a result, the area of the current loop may be reduced and thus decreasing the parasitic inductance effect (i.e., the ESL of the laminated capacitor).

Figure 1:
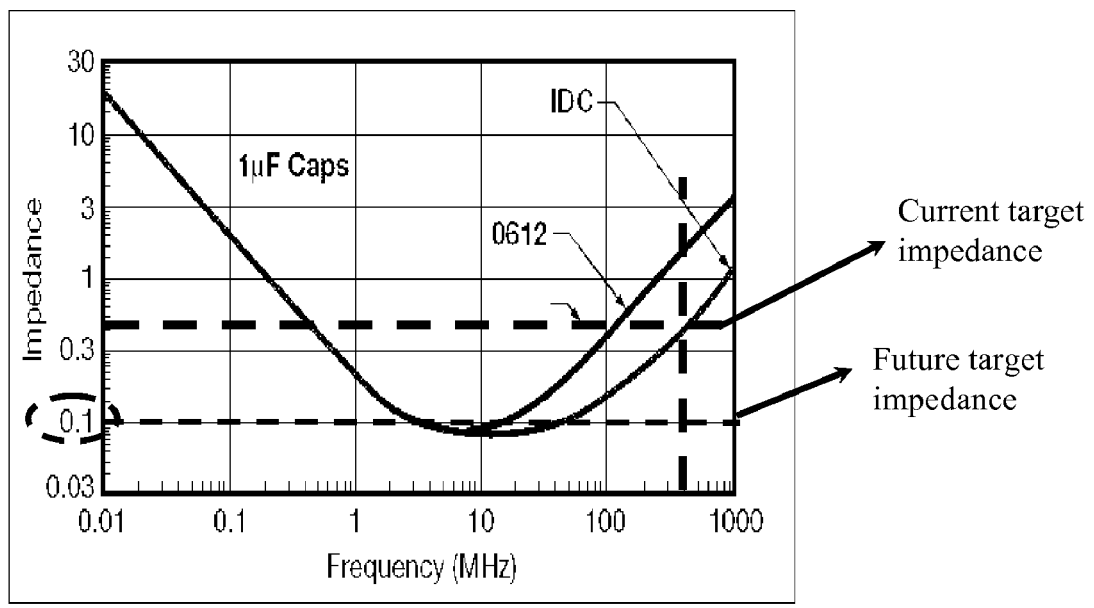
FIG. 1 is an impedance curve for exemplary surface mounted capacitors in the prior art.
Figure 2:
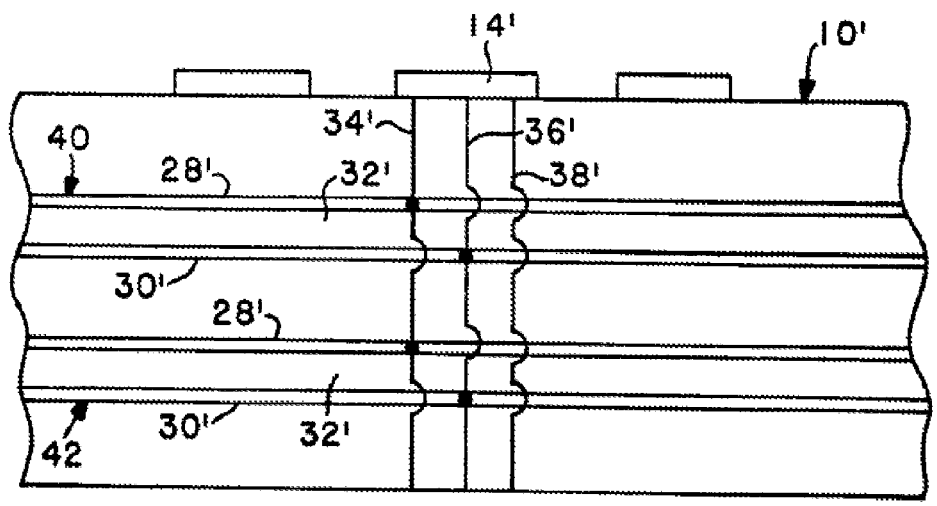
FIG. 2 shows conventional laminated capacitors in a multilayer circuit board in the prior art.
Figure 3:
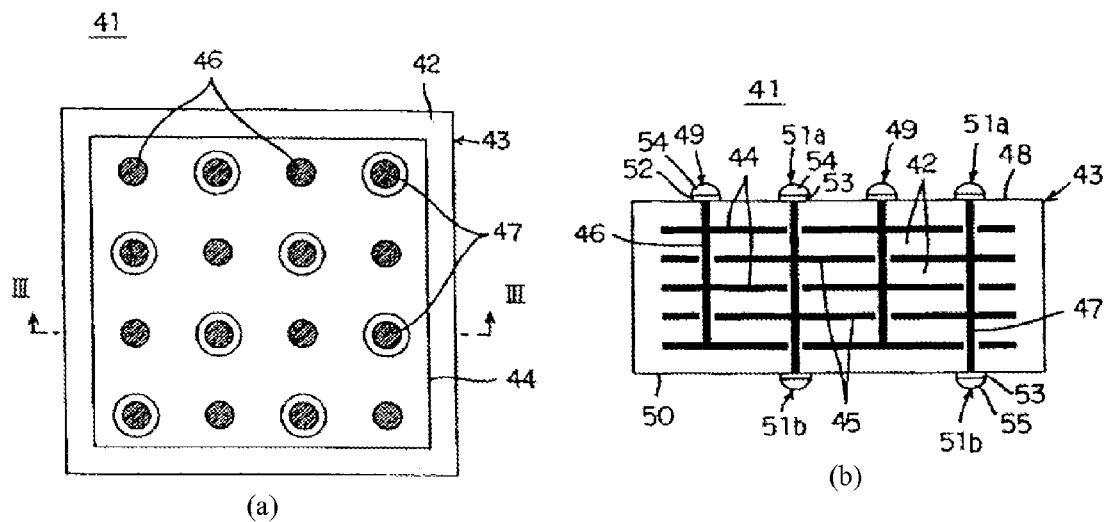
FIG. 3(a) is a plan view of an internal structure of a conventional laminated capacitor in the prior art.
FIG. 3(b) is a cross section view of the structure of FIG. 3(b)
Figure 4:
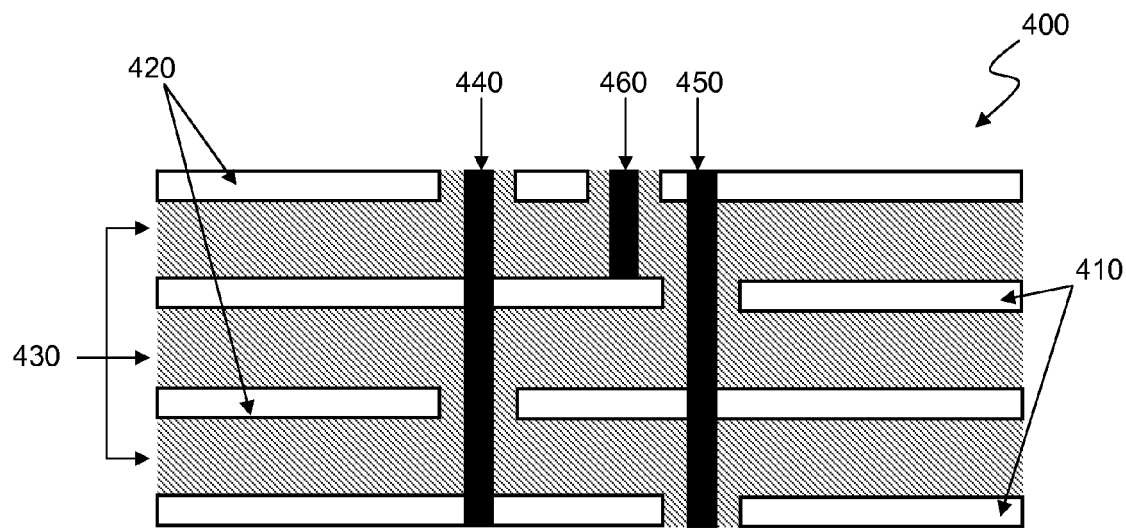
FIG. 4 is a cross sectional view of laminated capacitors in a circuit board in examples consistent with the present invention.

FIG. 4 is a cross sectional view of laminated capacitors with a wiring connection structure in examples consistent with the present invention. Referring to FIG. 4, a multilayer capacitor 400 may include at least one first electrode 410 and at least one second electrode 420 opposed to the first electrode 410. Each pair of the first electrode 410 and the second electrode 420 has a dielectric layer 430 disposed therebetween to form a capacitive element in the laminated capacitor 400. Multiple pairs of the first and second electrodes 410 and 420 are provided in the example illustrated at FIG. 4. The electrodes 410 and 420 may be formed from any conductive materials. In one example, the electrodes 410 and 420 are made of copper. The dielectric layer 430 may be formed from a dielectric material, such as ceramic dielectric material in one example.

Within the capacitor 400, at least one power via 440 and at least one ground via 450 may be substantially formed in the thickness direction of the dielectric layers 430, extending through a specified dielectric layers 430. At least one of the power vias 440 and one of the ground vias 450 may extend from the top surface of the capacitor 400 to the bottom surface of the capacitor 400. The power via 440 and ground via 450 may be formed by, for example, a laser drilling process, copper etched process, plasma-etching, punching, drilling, and electrolytic plated process. The power via 440 and ground via 450 may be subsequently filled with or coated with a conductive paste to form conductors. In one example, the power via 440 and ground via 450 are coated with copper. With copper plating, the power via 440 may be electrically coupled to the first electrodes 410 and is electrically isolated from connecting to the second electrodes 420. On the other hand, the ground via 450 is electrically coupled to the second electrodes 420 and is electrically isolated from connecting to the first electrodes 410. As a result, a number of capacitive elements are generated between the electrodes 410 and 420 connected in parallel through the power via 440 and ground via 450.

Referring again to FIG. 4, the multilayer capacitor 400 may also include at least one supplemental via 460 disposed between each pair of the power vias 440 and ground vias 450. The supplemental via 460 has a length shorter than the length of either the power via 440 or the ground via 450. As was the case with the power via 440 and ground via 450, the supplemental via 460 may be formed by, for example, a laser drilling process, build-up process, plasma etching, punching, drilling, and electrolytic plated process. Each of the power via, the ground via and the supplemental via may have a shape selected from cylindrical vias, other shaped vias and combinations thereof. The supplemental via 460 may be subsequently filled with or coated with a conductive paste to form conductors. In one example, the supplemental via 460 is coated with copper. When the supplemental via 460 is disposed relatively closer to a ground via 450 as shown at FIG. 4, the supplemental via 460 is electrically coupled to the power via 440. On the other hand, when the supplemental via 460 is disposed relatively closer to a power via 440, the supplemental via 460 is electrically coupled the ground via 450. The supplemental via 460 is arranged to direct the electrical current to flow through the supplemental via 460 and one of the pair of a power vias 440 and a ground vias 450 which is closer to the supplemental via 460. As a result, the area of the current loop is reduced and the parasitic inductance effect decreases.

Figure 5:
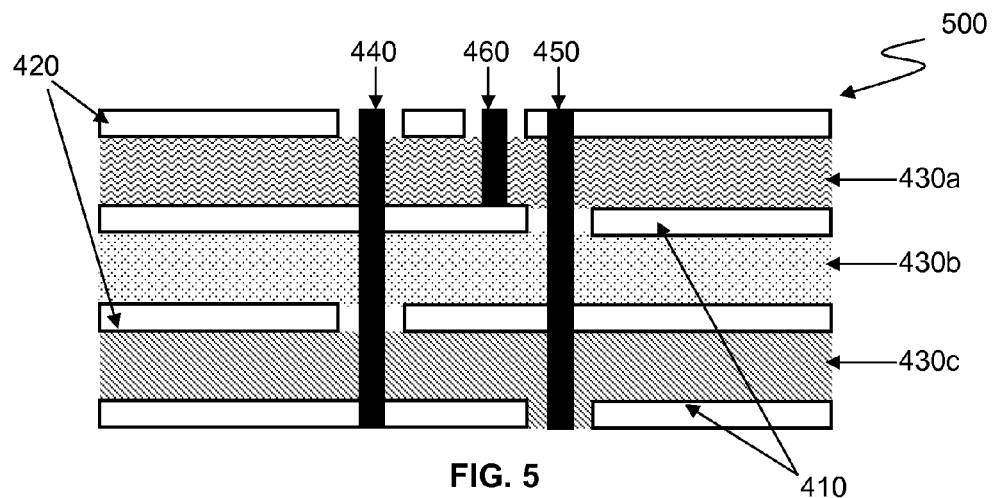
FIG. 5 is a cross sectional view of laminated capacitors in a circuit board in examples consistent with the present invention.

FIG. 5 shows laminated capacitor in examples consistent with the present invention. Referring to FIG. 5, the laminated capacitor 500 is similar to the capacitor 400 of FIG. 4, except that the dielectric layers 430a, 430b and 430c in the capacitor 500 may be of different dielectric materials providing different dielectric constants.

Figure 6:
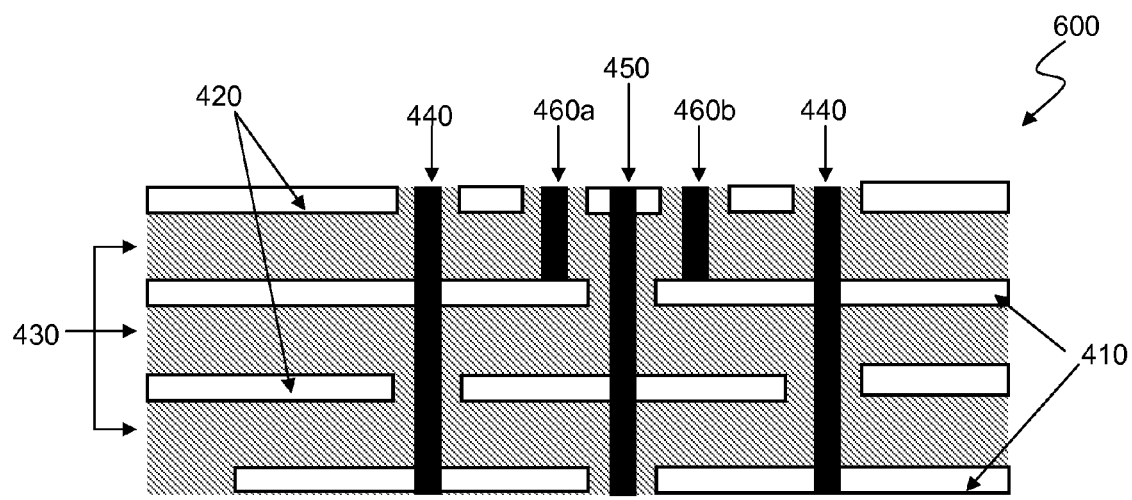
FIG. 6 is a cross sectional view of laminated capacitors in a circuit board in examples consistent with the present invention.

FIG. 6 shows multilayer capacitor in examples consistent with the present invention. Referring to FIG. 6, the multilayer capacitor 600 is similar to the capacitor 400 of FIG. 4, except that the multilayer capacitor 600 may include two supplemental vias 460a and 460b, wherein each supplemental via is disposed between one pair of the power via 440 and ground via 450.

Figure 7:
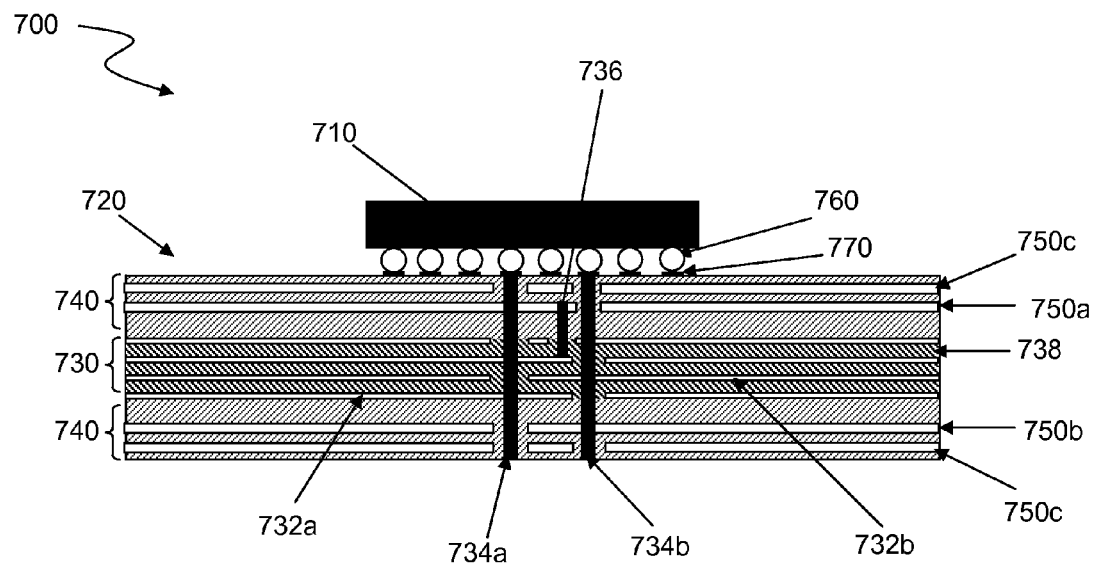
FIG. 7 is a cross sectional view of a circuit board with a laminated capacitor in examples consistent with the present invention.

FIG. 7 illustrates a microprocessor where a laminated capacitor is used as a decoupling capacitor in an example consistent with the present invention. The microprocessor 700 may include an integrated circuit 710 electronically coupled to a circuit board 720 through solder bumps 760 and solder pads 770. The circuit board 720 may include a laminated capacitor 730 and a wiring board 740. The laminated capacitor 730 has a structure consistent with the present invention where the electrode 732a and 732b are respectively connected to a power via 734a and a ground via 734b. A supplemental via 736 is displaced between the power via 734a and the ground via 734b and, in one example, is relatively closer to the ground via 734b. There are a number of dielectric layers 738, each of which is sandwiched between two neighboring conductive layers. Referring to FIG. 7, the ground via 734b is electrically coupled to the ground plane 750b provided by the wiring board 740 and the supplemental via 736 is electrically coupled to the power plane 750a provided by the wiring board 740. The ground via 734b and the supplemental via 736 are electrically coupled to the integrated circuit 710 through the solder bumps 760 and solder pads 770 for decoupling. In this manner, when the circuit operates in high frequencies, the current flows through the ground via 734b and the supplemental via 736 and thus reduces the current loop area and decreases the parasitic effect. The laminated capacitors may be used in a variety of printed circuit applications. For example, they may be coupled with or embedded within rigid and/or flexible electrical circuit, printed circuit boards or other microelectronic devices such as chip packages.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A laminated capacitor, comprising:
    a number of conductive layers including a top conductive layer and a bottom conductive layer, the conductive layers including a set of first conductive layers and a set of second conductive layers;
    a power via extending along a thickness direction of the laminated capacitor and arranged to extend from the top conductive layer to the bottom conductive layer, the power via being electrically coupled to the first conductive layers;
    a ground via extending along the thickness direction of the laminated capacitor and arranged to extend from the top conductive layer to the bottom conductive layer, the ground via being electrically coupled to the second conductive layers; and
    a supplemental via between the power via and the ground via, the supplemental via being shorter in length than the power via and the ground via, wherein the supplemental via is electrically coupled to one of the first conductive layers and the second conductive layers.

2. The capacitor of claim 1, wherein the power via, the ground via and the supplemental via are in a shape selected from cylindrical vias, any other shaped vias and combinations thereof.

3. The capacitor of claim 1, wherein the supplemental via is electrically coupled to one of the first conductive layers and the second conductive layers depending on which of power via and ground via is disposed relatively closer to the supplemental via.

4. The capacitor of claim 1, wherein the supplemental via is electrically coupled to the first conductive layers when the supplemental via is disposed relatively closer to the ground via.

5. The capacitor of claim 1, wherein the supplemental via is electrically coupled to the second conductive layers when the supplemental via is disposed relatively closer to the power via.

6. A laminated capacitor embedded in a circuit board, comprising:
    a number of conductive layers including a top conductive layer and a bottom conductive layer, the conductive layers including a set of first conductive layers and a set of second conductive layers;
    a power via extending along a thickness direction of the laminated capacitor and arranged to extend from the top conductive layer to the bottom conductive layer, the power via being electrically coupled to the first conductive layers;
    a ground via extending along the thickness direction of the laminated capacitor and arranged to extend from the top conductive layer to the bottom conductive layer, the ground via being electrically coupled to the second conductive layers;

a supplemental via between the power via and the ground via, the supplemental via being shorter in length than the power via and the ground via, wherein the supplemental via is electrically coupled to one of the first conductive layers and the second conductive layers; and a number of dielectric layers, each dielectric layer being sandwiched between two neighboring conductive layers.

7. The capacitor of claim 6, wherein the dielectric layers are formed from dielectric materials of different dielectric constants.

8. The capacitor of claim 6, wherein the power via, the ground via and supplemental via are in a shape selected from cylindrical vias, any other shaped vias and combinations thereof.

9. The capacitor of claim 6, wherein the supplemental via is electrically coupled to one of the first conductive layers and the second conductive layers depending on which of power via and ground via is disposed relatively closer to the supplemental via.

10. The capacitor of claim 6, wherein the supplemental via is electrically coupled to the second conductive layers when the supplemental via is disposed relatively closer to the power via.

11. The capacitor of claim 6, wherein the supplemental via is electrically coupled to the first conductive layers when the supplemental via is disposed relatively closer to the ground via.

12. An integrated circuit substrate to which an integrated circuit chip is electrically coupled, comprising:

a wiring board comprising a power plane and a ground plane; and a laminated capacitor being electrically coupled to the power plane and ground plane, and wherein the laminated capacitor comprises:

a number of conductive layers including a top conductor layer and a bottom conductive layer, the conductive layers including a set of first conductive layers and a set of second conductive layers;

a power via extending along a thickness direction of the laminated capacitor and arranged to extend from the top conductive layer to the bottom conductive layer, the power via being electrically coupled to the first conductive layers;

a ground via extending along the thickness direction of the laminated capacitor and arranged to extend from the top conductive layer to the bottom conductive layer, the ground via being electrically coupled to the second conductive layers;

a supplemental via between the power via and the ground via, the supplemental via being shorter in length than the power via and the ground via, wherein the supplemental via is electrically coupled to one of the first conductive layers and the second conductive layers; and a number of dielectric layers, each dielectric layer being sandwiched between two neighboring conductive layers.

13. The integrated circuit substrate of claim 12, wherein the ground via is electrically coupled to the ground plane and the supplemental via is electrically coupled to the power plane.

14. The integrated circuit substrate of claim 12, wherein the power via is electrically coupled to the power plane and the supplemental via is electrically coupled to the ground plane.

15. The integrated circuit substrate of claim 12, wherein the dielectric layers are formed from dielectric materials of different dielectric constants.

16. The integrated circuit substrate of claim 12, wherein the power via, the ground via and the supplemental via are in a shape selected from cylindrical vias, any other shaped vias and combinations thereof.

17. The integrated circuit substrate of claim 12, wherein the supplemental via is electrically coupled to one of the first conductive layers and the second conductive layers depending on which of power via and ground via is disposed relatively closer to the supplemental via.

18. The integrated circuit substrate of claim 12, wherein the supplemental via is electrically coupled to the second conductive layers when the supplemental vis is disposed relatively closer to the power via.

19. The integrated circuit substrate of claim 12, wherein the supplemental via is electrically coupled to the first conductive layer when the supplemental via is disposed relatively closer to the ground via.

* * * * *